US010288667B2

(12) United States Patent
Pignati et al.

(10) Patent No.: US 10,288,667 B2
(45) Date of Patent: May 14, 2019

(54) METHOD AND SYSTEM FOR FAULT DETECTION AND FAULTED LINE IDENTIFICATION IN POWER SYSTEMS USING SYNCHROPHASORS-BASED REAL-TIME STATE ESTIMATION

(71) Applicant: Ecole Polytechnique Fédérale de Lausanne (EPFL), Lausanne (CH)

(72) Inventors: Marco Pignati, Lausanne (CH); Lorenzo Zanni, Saint-Sulpice (CH); Paolo Romano, Lausanne (CH); Mario Paolone, La Conversion (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 106 days.

(21) Appl. No.: 15/158,791

(22) Filed: May 19, 2016

(65) Prior Publication Data
US 2017/0336465 A1 Nov. 23, 2017

(51) Int. Cl.
*G01R 31/08* (2006.01)
*G01R 19/25* (2006.01)

(52) U.S. Cl.
CPC ......... *G01R 31/088* (2013.01); *G01R 31/086* (2013.01); *G01R 19/2513* (2013.01); *Y02E 60/728* (2013.01); *Y04S 10/265* (2013.01); *Y04S 10/522* (2013.01)

(58) Field of Classification Search
None
See application file for complete search history.

(56) References Cited

U.S. PATENT DOCUMENTS

| 8,634,965 | B1* | 1/2014 | Gou | H02J 13/0006 |
| | | | | 700/286 |
| 2011/0178741 | A1* | 7/2011 | Saha | G01R 31/085 |
| | | | | 702/59 |
| 2012/0022713 | A1* | 1/2012 | Deaver, Sr. | G05B 17/02 |
| | | | | 700/298 |

(Continued)

OTHER PUBLICATIONS

Dobakhshari, A novel method for fault location of transmission lines by wide-area voltage measurements considering measurement errors, Mar. 2015, IEEE Transactions on Smart Grid, 6(2), 874-884.*

(Continued)

*Primary Examiner* — Alexander Satanovsky
*Assistant Examiner* — Lina M Cordero
(74) *Attorney, Agent, or Firm* — Andre Roland S.A.; Nikolaus Schibli

(57) ABSTRACT

A method for a faulted line identification in a power network, including, at a generic time-instant, solving a plurality of parallel phasor measurement units based real-time state estimators, the state estimators having among each other different and augmented network topologies, each of the augmented network topologies comprises an original network topology, which includes a plurality of real buses and real lines forming a connected graph mapping the real network topology, and a single additional virtual bus located along one of the real lines, the line in which the virtual bus is located has to be different for each of the augmented network topologies.

5 Claims, 21 Drawing Sheets

(56) References Cited

U.S. PATENT DOCUMENTS

2016/0291076 A1* 10/2016 Rieken ............... G01R 19/2513

OTHER PUBLICATIONS

"NASPI 2014 survey of synchrophasor system networks—results and findings," NASPI, Tech. Rep., Jul. 2015.

"Perfect power prototype for Illinois Institute of Technology," DOE Award No. DE-FC26-08NT02875, Tech. Rep., Dec. 29, 2014.

"Protection of distribution systems with distributed energy resources," Joint Working Group B5/C6.26/CIRED, Tech. Rep., Mar. 2015.

A. Abur and A. Exposito, Power system state estimation: theory and implementation. CRC, 2004, vol. 24.

A. Abur, H. Kim, and M. Celik, "Identifying the unknown circuit breaker statuses in power networks," IEEE Transactions on Power Systems, vol. 10, No. 4, pp. 2029-2037, Nov. 1995.

A. Borghetti, M. Bosetti, C. Nucci, M. Paolone, and A. Abur, "Integrated use of time-frequency wavelet decompositions for fault location in distribution networks: Theory and experimental validation," IEEE Trans. on Power Delivery, vol. 25, No. 4, pp. 3139-3146, Oct. 2010.

A. T. Johns and S. Jamali, "Accurate fault location technique for powertransmission lines," IEE Proceedings C—Generation, Transmission and Distribution, vol. 137, No. 6, pp. 395-402, Nov. 1990.

A. von Meier, D. Culler, A. McEachern, and R. Arghandeh, "Microsynchrophasors for distribution systems," in Innovative Smart Grid Technologies Conference (ISGT), 2014 IEEE PES, Feb. 2014, pp. 1-5.

D. Haughton and G. Heydt, "A linear state estimation formulation for smart distribution systems," IEEE Transactions on Power Systems, vol. 28, No. 2, pp. 1187-1195, May 2013.

E. Andreoli, A. Costa, and K. Clements, "Topology validation Via simultaneous state & topology estimation with phasor data processing capability," in Power Systems Computation Conference (PSCC), 2014, Aug. 2014, pp. 1-7.

E. Caro, R. Singh, B. Pal, A. J. Conejo, and R. Jabr, "Participation factor approach for phasor measurement unit placement in power system state estimation," IET generation, transmission & distribution, vol. 6, No. 9, pp. 922-929, 2012.

F. H. Magnago and A. Abur, "Fault location using wavelets," IEEE Transactions on Power Delivery, vol. 13, No. 4, pp. 1475-1480, Oct. 1998.

F. Li and R. Bo, "Small test systems for power system economic studies," in Power and Energy Society General Meeting, 2010 IEEE, Jul. 2010, pp. 1-4.

F. Wu and W.-H. Liu, "Detection of topology errors by state estimation [power systems]," IEEE Transactions on Power Systems, vol. 4, No. 1, pp. 176-183, Feb. 1989.

J. Liu, J. Tang, F. Ponci, A. Monti, C. Muscas, and P. Pegoraro, "Tradeoffs in PMU deployment for state estimation in active distribution grids," IEEE Transactions on Smart Grid, vol. 3, No. 2, pp. 915-924, 2012.

J. Mora-Flòrez, J. Melèndez, and G. Carrillo-Caicedo, "Comparison of impedance based fault location methods for power distribution systems," Electric Power Systems Research, vol. 78, No. 4, pp. 657-666, 2008.

J. Ren, S. Venkata, and E. Sortomme, "An accurate synchrophasor based fault location method for emerging distribution systems," IEEE Transactions on Power Delivery, vol. 29, No. 1, pp. 297-298, Feb. 2014.

J. Zhang, G. Welch, G. Bishop, and Z. Huang, "A two-stage kalman filtering approach for robust and real-time power systems state tracking," IEEE Trans. Sustain. Energy, vol. 5, No. 2, p. 629-636, 2014.

K.-P. Lien, C.-W. Liu, C.-S. Yu, and J. A. Jiang, "Transmission network fault location observability with minimal prnu placement," IEEE Transactions on Power Delivery, vol. 21, No. 3, pp. 1128-1136, Jul. 2006.

M. Pignati, L. Zanni, S. Sarri, R. Cherkaoui, J.-Y. Le Boudec, and M. Paolone, "A pre-estimation filtering process of bad data for linear power systems state estimators using PMUs," in Power Systems Computation Conference (PSCC), 2014, Aug. 2014, pp. 1-8.

M. Pignati, M. Popovic, S. Barreto, R. Cherkaoui, G. Dario Flores, J.-Y. Le Boudec, M. Mohiuddin, M. Paolone, P. Romano, S. Sarri, T. Tesfay, D.-C. Tomozei, and L. Zanni, "Real-time state estimation of the EPFLcampus medium-voltage grid by using PMUs," in Innovative Smart Grid Technologies Conference (ISGT), 2015 IEEE Power & Energy Society, Feb. 2015, pp. 1-5.

M. Shiroei, S. Daniar, and M. Akhbari, "A new algorithm for fault location on transmission lines," in Power Energy Society General Meeting, 2009. PES '09. IEEE, Jul. 2009, pp. 1-5.

Open PDC Phasor Data concentrator, Grid Protection Alliance, Product brochure, Version 2.0, 2014, Available: http://openpdc.codeplex.com/.

P. Janssen, "Monitoring, protection and fault location in power distribution networks using system-wide measurements," Ph.D. dissertation, Ecole Polytechnique de Bruxelles, 2013-2014.

P. Navalkar and S. Soman, "Secure remote backup protection of transmission lines using synchrophasors," IEEE Transactions on Power Delivery, vol. 26, No. 1, pp. 87-96, Jan. 2011.

P. Romano and M. Paolone, "Enhanced interpolated-DFT for synchrophasor estimation in FPGAs: Theory, implementation, and validation of a PMU prototype," IEEE Transactions on Instrumentation and Measurement, vol. 63, No. 12, pp. 2824-2836, Dec. 2014.

P. Romano, M. Pignati, and M. Paolone, "Integration of an IEEE std. c37.118 compliant PMU into a real-time simulator," in the 2015 IEEE PowerTech Conference, 2015.

S. Sarri, L. Zanni, M. Popovic, J.-Y. Le Boudec, and M. Paolone, "Performance assessment of linear state estimators using synchrophasor measurements," IEEE Transactions on Instrumentation and Measurement, vol. 65, No. 3, pp. 535-548, Mar. 2016.

V. Freitas and A. Simoes Costa, "Integrated state & topology estimation based on a priori topology information," in PowerTech, 2015 IEEE Eindhoven, Jun. 2015, pp. 1-6.

* cited by examiner

TABLE I
DISTRIBUTION: 3-PH FAULT, 1 Ω

| Fault Position | | Noise Level | |
|---|---|---|---|
| | | 1 | 10 |
| $L_{4,5}$ | 1/4 | 100% | 100% |
| | 1/2 | 100% | 100% |
| $L_{9,10}$ | 1/4 | 100% | 100% |
| | 1/2 | 100% | 100% |
| $L_{13,16}$ | 1/4 | 100% | 100% |
| | 1/2 | 100% | 100% |

FIG. 11

TABLE II
DISTRIBUTION: 3-PH FAULT, 100 Ω

| Fault Position | | Noise Level | |
|---|---|---|---|
| | | 1 | 10 |
| $L_{4,5}$ | 1/4 | 100% | 99.27% |
| | 1/2 | 100% | 99.85% |
| $L_{9,10}$ | 1/4 | 100% | 98.54% |
| | 1/2 | 100% | 99.90% |
| $L_{13,16}$ | 1/4 | 100% | 84.65% |
| | 1/2 | 100% | 99.74% |

FIG. 12

TABLE III
DISTRIBUTION: 2-PH FAULT:
EARTHED NEUTRAL, 1 Ω

| Fault Position | | Noise Level | |
|---|---|---|---|
| | | 1 | 10 |
| $L_{4,5}$ | 1/4 | 100% | 100% |
| | 1/2 | 100% | 100% |
| $L_{9,10}$ | 1/4 | 100% | 100% |
| | 1/2 | 100% | 100% |
| $L_{13,16}$ | 1/4 | 100% | 100% |
| | 1/2 | 100% | 100% |

FIG. 13

TABLE IV
DISTRIBUTION: 2-PH FAULT:
EARTHED NEUTRAL, 100 Ω

| Fault Position | | Noise Level | |
|---|---|---|---|
| | | 1 | 10 |
| $L_{4,5}$ | 1/4 | 100% | 92.48% |
| | 1/2 | 100% | 92.91% |
| $L_{9,10}$ | 1/4 | 100% | 89.56% |
| | 1/2 | 100% | 95.09% |
| $L_{13,16}$ | 1/4 | 100% | 68.43% |
| | 1/2 | 100% | 91.73% |

FIG. 14

TABLE V
DISTRIBUTION: 2-PH FAULT:
UNEARTHED NEUTRAL, 1 Ω

| Fault Position | | Noise Level | |
|---|---|---|---|
| | | 1 | 10 |
| $L_{4,5}$ | 1/4 | 100% | 100% |
| | 1/2 | 100% | 100% |
| $L_{9,10}$ | 1/4 | 100% | 100% |
| | 1/2 | 100% | 100% |
| $L_{13,16}$ | 1/4 | 100% | 100% |
| | 1/2 | 100% | 100% |

FIG. 15

TABLE VI
DISTRIBUTION: 2-PH FAULT:
UNEARTHED NEUTRAL, 100 Ω

| Fault Position | | Noise Level | |
|---|---|---|---|
| | | 1 | 10 |
| $L_{4,5}$ | 1/4 | 100% | 92.41% |
| | 1/2 | 100% | 92.83% |
| $L_{9,10}$ | 1/4 | 100% | 89.38% |
| | 1/2 | 100% | 95.20% |
| $L_{13,16}$ | 1/4 | 100% | 67.57% |
| | 1/2 | 100% | 92.32% |

FIG. 16

TABLE VII
DISTRIBUTION: 1-PH-TO-GROUND
FAULT: EARTHED NEUTRAL, 1 Ω

| Fault Position | | Noise Level | |
|---|---|---|---|
| | | 1 | 10 |
| $L_{4,5}$ | 1/4 | 100% | 100% |
| | 1/2 | 100% | 100% |
| $L_{9,10}$ | 1/4 | 100% | 100% |
| | 1/2 | 100% | 100% |
| $L_{13,16}$ | 1/4 | 100% | 100% |
| | 1/2 | 100% | 100% |

FIG. 17

TABLE VIII
DISTRIBUTION: 1-PH-TO-GROUND
FAULT: EARTHED NEUTRAL, 100 Ω

| Fault Position | | Noise Level | |
|---|---|---|---|
| | | 1 | 10 |
| $L_{4,5}$ | 1/4 | 100% | 83.78% |
| | 1/2 | 100% | 99.99% |
| $L_{9,10}$ | 1/4 | 100% | 95.05% |
| | 1/2 | 100% | 99.23% |
| $L_{13,16}$ | 1/4 | 100% | 96.06% |
| | 1/2 | 100% | 99.36% |

FIG. 18

TABLE IX
DISTRIBUTION: 1-PH-TO GROUND
FAULT: UNEARTHED NEUTRAL, 1 Ω

| Fault Position | | Noise Level | |
| --- | --- | --- | --- |
| | | 1 | 10 |
| $L_{4,5}$ | 1/4 | 100% | 69.84% |
| | 1/2 | 100% | 87.28% |
| $L_{9,10}$ | 1/4 | 100% | 72.69% |
| | 1/2 | 100% | 77.82% |
| $L_{13,16}$ | 1/4 | 100% | 72.08% |
| | 1/2 | 100% | 79.33% |

FIG. 19

TABLE X
DISTRIBUTION: 1-PH-TO GROUND
FAULT: UNEARTHED NEUTRAL, 100Ω

| Fault Position | | Noise Level | |
| --- | --- | --- | --- |
| | | 1 | 10 |
| $L_{4,5}$ | 1/4 | 100% | 70.95% |
| | 1/2 | 100% | 99.66% |
| $L_{9,10}$ | 1/4 | 100% | 89.99% |
| | 1/2 | 100% | 97.94% |
| $L_{13,16}$ | 1/4 | 100% | 87.56% |
| | 1/2 | 100% | 95.74% |

FIG. 20

TABLE XI
TRANSMISSION: 3-PH FAULT, 1 Ω

| Fault Position | | Noise Level | |
|---|---|---|---|
| | | 1 | 10 |
| $L_{1,3}$ | 1/4 | 100% | 100% |
| | 1/2 | 100% | 100% |
| $L_{3,4}$ | 1/4 | 100% | 100% |
| | 1/2 | 100% | 100% |
| $L_{1,5}$ | 1/4 | 100% | 100% |
| | 1/2 | 100% | 100% |

FIG. 21

TABLE XII
TRANSMISSION: 3-PH FAULT, 100 Ω

| Fault Position | | Noise Level | |
|---|---|---|---|
| | | 1 | 10 |
| $L_{1,3}$ | 1/4 | 100% | 100% |
| | 1/2 | 100% | 100% |
| $L_{3,4}$ | 1/4 | 100% | 100% |
| | 1/2 | 100% | 100% |
| $L_{1,5}$ | 1/4 | 100% | 67.54% |
| | 1/2 | 100% | 100% |

FIG. 22

TABLE XIII
TRANSMISSION: 2-PH-TO GROUND
FAULT, 1 Ω

| Fault Position | | Noise Level | |
|---|---|---|---|
| | | 1 | 10 |
| $L_{1,3}$ | 1/4 | 100% | 100% |
| | 1/2 | 100% | 100% |
| $L_{3,4}$ | 1/4 | 100% | 100% |
| | 1/2 | 100% | 100% |
| $L_{1,5}$ | 1/4 | 100% | 100% |
| | 1/2 | 100% | 100% |

FIG. 23

TABLE XIV
TRANSMISSION: 2-PH-TO GROUND
FAULT, 100 Ω

| Fault Position | | Noise Level | |
|---|---|---|---|
| | | 1 | 10 |
| $L_{1,3}$ | 1/4 | 100% | 100% |
| | 1/2 | 100% | 100% |
| $L_{3,4}$ | 1/4 | 100% | 100% |
| | 1/2 | 100% | 100% |
| $L_{1,5}$ | 1/4 | 100% | 59.59% |
| | 1/2 | 100% | 100% |

FIG. 24

TABLE XV
TRANSMISSION: 2-PH FAULT, 1 Ω

| Fault Position | | Noise Level | |
|---|---|---|---|
| | | 1 | 10 |
| $L_{1,3}$ | 1/4 | 100% | 100% |
| | 1/2 | 100% | 100% |
| $L_{3,4}$ | 1/4 | 100% | 100% |
| | 1/2 | 100% | 100% |
| $L_{1,5}$ | 1/4 | 100% | 100% |
| | 1/2 | 100% | 100% |

FIG. 25

TABLE XVI
TRANSMISSION: 2-PH FAULT, 100 Ω

| Fault Position | | Noise Level | |
|---|---|---|---|
| | | 1 | 10 |
| $L_{1,3}$ | 1/4 | 100% | 100% |
| | 1/2 | 100% | 100% |
| $L_{3,4}$ | 1/4 | 100% | 100% |
| | 1/2 | 100% | 100% |
| $L_{1,5}$ | 1/4 | 100% | 96.75% |
| | 1/2 | 100% | 100% |

FIG. 26

TABLE XVII
Transmission: 1-ph-to ground
fault, 1 Ω

| Fault Position | | Noise Level | |
|---|---|---|---|
| | | 1 | 10 |
| $L_{1,3}$ | 1/4 | 100% | 100% |
| | 1/2 | 100% | 100% |
| $L_{3,4}$ | 1/4 | 100% | 100% |
| | 1/2 | 100% | 100% |
| $L_{1,5}$ | 1/4 | 100% | 100% |
| | 1/2 | 100% | 100% |

FIG. 27

TABLE XVIII
Transmission: 1-ph-to ground
fault, 100 Ω

| Fault Position | | Noise Level | |
|---|---|---|---|
| | | 1 | 10 |
| $L_{1,3}$ | 1/4 | 100% | 99.99% |
| | 1/2 | 100% | 100% |
| $L_{3,4}$ | 1/4 | 100% | 99.86% |
| | 1/2 | 100% | 100% |
| $L_{1,5}$ | 1/4 | 100% | 87.19% |
| | 1/2 | 100% | 100% |

FIG. 28

TABLE XIX

DISTRIBUTION: 1-PH-TO GROUND FAULT: UNEARTHED NEUTRAL, 1000 Ω

| Fault Position | | Noise Level |
|---|---|---|
| | | 1 |
| $L_{4,5}$ | 1/4 | 80.94% |
| | 1/2 | 99.99% |
| $L_{9,10}$ | 1/4 | 95.92% |
| | 1/2 | 99.30% |
| $L_{13,16}$ | 1/4 | 95.93% |
| | 1/2 | 99.32% |

FIG. 29

TABLE XX

DISTRIBUTION: DISTRIBUTED GENERATION, UNEARTHED NEUTRAL: FAULT AT 1/4 OF $L_{13,16}$, 100 Ω

| Scenario | Fault Type | Noise Level | |
|---|---|---|---|
| | | 1 | 10 |
| Case 1 | 3-ph | 100% | 82.73% |
| | 2-ph | 100% | 66.66% |
| | 1-ph | 100% | 80.74% |
| Case 2 | 3-ph | 100% | 83.08% |
| | 2-ph | 100% | 67.43% |
| | 1-ph | 100% | 82.34% |
| Case 3 | 3-ph | 100% | 84.62% |
| | 2-ph | 100% | 69.71% |
| | 1-ph | 100% | 83.40% |

FIG. 30

TABLE XXI
ELECTRICAL PARAMETERS OF THE LINES

| | length [km] | $R_0 \left[\frac{\Omega}{km}\right]$ | $X_0 \left[\frac{\Omega}{km}\right]$ | $B_0 \left[\frac{S}{km}\right]$ | $R_P \left[\frac{\Omega}{km}\right]$ | $X_P \left[\frac{\Omega}{km}\right]$ | $B_P \left[\frac{S}{km}\right]$ |
|---|---|---|---|---|---|---|---|
| $L_{1,2}$ | 0.74464 | 1.0571 | 0.9104 | 7.3390e-5 | 0.1393 | 0.0752 | 1.4794e-4 |
| $L_{2,3}$ | 0.92883 | 1.0568 | 0.9095 | 7.6043e-5 | 0.1393 | 0.0752 | 1.4718e-4 |
| $L_{3,4}$ | 1.43843 | 0.8439 | 0.1967 | 1.1959e-5 | 0.1593 | 0.0874 | 1.4495e-4 |
| $L_{4,5}$ | 1.81345 | 1.0405 | 0.8551 | 7.1209e-5 | 0.1408 | 0.0761 | 1.4942e-4 |
| $L_{5,6}$ | 0.7059 | 0.8150 | 0.1000 | 1.4137e-5 | 0.1620 | 0.0890 | 1.4137e-4 |
| $L_{6,7}$ | 0.31992 | 0.8150 | 0.1000 | 1.4137e-5 | 0.1620 | 0.0890 | 1.4137e-4 |
| $L_{7,8}$ | 0.4312 | 0.8150 | 0.1000 | 1.4137e-5 | 0.1620 | 0.0890 | 1.4137e-4 |
| $L_{8,9}$ | 0.5916 | 0.8150 | 0.1000 | 1.4137e-5 | 0.1620 | 0.0890 | 1.4137e-4 |
| $L_{9,10}$ | 0.56363 | 0.8150 | 0.1000 | 1.4137e-5 | 0.1620 | 0.0890 | 1.4137e-4 |
| $L_{10,11}$ | 0.45427 | 0.8150 | 0.1000 | 1.4137e-5 | 0.1620 | 0.0890 | 1.4137e-4 |
| $L_{11,12}$ | 0.42235 | 1.2369 | 1.3535 | 5.5964e-5 | 0.3571 | 0.0824 | 1.0621e-4 |
| $L_{5,13}$ | 0.51052 | 1.0600 | 0.9200 | 7.3828e-5 | 0.1390 | 0.0750 | 1.4765e-4 |
| $L_{13,14}$ | 0.457 | 1.0600 | 0.9200 | 7.3828e-5 | 0.1390 | 0.0750 | 1.4765e-4 |
| $L_{14,15}$ | 0.47166 | 1.0600 | 0.9200 | 7.3828e-5 | 0.1390 | 0.0750 | 1.4765e-4 |
| $L_{13,16}$ | 0.22738 | 1.2400 | 1.3800 | 5.3407e-5 | 0.3560 | 0.0820 | 1.0681e-4 |
| $L_{16,17}$ | 0.21808 | 1.2400 | 1.3800 | 5.3407e-5 | 0.3560 | 0.0820 | 1.0681e-4 |
| $L_{17,18}$ | 0.41697 | 1.1922 | 0.9745 | 8.7439e-5 | 0.3734 | 0.0883 | 1.0003e-4 |

FIG. 31

TABLE XXII
MEASUREMENT SENSORS AND PMU ACCURACY

| Noise level 1 | $\sigma_{V_{mag}} = 1.6 \cdot 10^{-3}$ % | $\sigma_{V_{ph}} = 5.1 \cdot 10^{-5}$ [rad] |
|---|---|---|
| | $\sigma_{I_{mag}} = 4.0 \cdot 10^{-1}$ % | $\sigma_{I_{ph}} = 5.8 \cdot 10^{-3}$ [rad] |
| Noise level 10 | $\sigma_{V_{mag}} = 1.6 \cdot 10^{-2}$ % | $\sigma_{V_{ph}} = 5.1 \cdot 10^{-4}$ [rad] |
| | $\sigma_{I_{mag}} = 4.0$ % | $\sigma_{I_{ph}} = 5.8 \cdot 10^{-2}$ [rad] |

FIG. 32

TABLE XXIII
CURRENT PROTECTION SENSORS AND PMU ACCURACY

| Noise level 1 | $\sigma_{I_{mag}} = 4.0$ % | $\sigma_{I_{ph}} = 5.8 \cdot 10^{-2}$ [rad] |
|---|---|---|
| Noise level 10 | $\sigma_{I_{mag}} = 12.0$ % | $\sigma_{I_{ph}} = 1.7 \cdot 10^{-1}$ [rad] |

FIG. 33

METHOD AND SYSTEM FOR FAULT DETECTION AND FAULTED LINE IDENTIFICATION IN POWER SYSTEMS USING SYNCHROPHASORS-BASED REAL-TIME STATE ESTIMATION

TECHNICAL FIELD

The present invention relates to the field of power system, and more particularly is related to a system and a method for fault detection and faulted line identification in a network of a power system.

DISCUSSION OF THE BACKGROUND

The massive integration of distributed generation (DG) of power is leading to important changes in the operation of distribution networks. In this context, the protection schemes are experiencing major transformations. Traditionally, fault detection together with the associated relaying schemes and fault location functionalities have been considered as separate processes since the latter usually requires computational efforts that do not fit the time latencies needed by the protections. Along the years, several fault detection and location methods have been proposed for distribution networks. The majority of them are based on impedance measurements, traveling waves or phasor measurements. However, the literature only discusses the possibility of merging the detection and location functionalities. Recent publications have discussed the use of phasor measurement units (PMUs) to develop low-latency and high-refresh rate real-time state estimators (SEs) for distribution networks. The use of low-cost hardware platforms is contributing to the massive use of PMUs in distribution networks. Dedicated installations in real distribution networks have demonstrated the feasibility of this solution. As an example, the active distribution network (ADN) can be equipped with PMUs in every bus measuring nodal voltages and injected current synchrophasors. By leveraging the distribution network operator need for real-time monitoring, other applications, such as fault detection and location, might be developed using this same metering infrastructure.

On the other hand, in transmission networks, PMU-based infrastructures have been a reality for many years now. The existing infrastructures can be upgraded to meet the requirements of real-time fault detection and location, especially in specific and limited portions of the power grid.

The conventional fault location methods currently employed in transmission networks can be classified into two major categories:
(1) Methods based on the fundamental frequency components of voltage and current signals, and
(2) Methods exploiting the characteristics of the fault-generated traveling waves. However, despite all the advancements in the field of fault location methods and systems for power grids, further improvements and solutions are necessary and required.

SUMMARY

In a first aspect the invention preferably provides a method for a faulted line identification in a power network, including, at a generic time-instant, solving a plurality of parallel phasor measurement units based real-time state estimators, the state estimators having among each other different and augmented network topologies. Each of the augmented network topologies comprises an original network topology, which comprises a plurality of real buses and real lines forming a connected graph mapping the real network topology, and a single additional virtual bus located along one of the real lines, the line in which the virtual bus is located has to be different for each of the augmented network topologies. The method further preferably comprises producing an estimated state for each state estimator; comparing the estimated states of the plurality of parallel state estimators to (i) detect a presence of a fault; (ii) identify a faulted line in which the presence of a fault is detected; and (iii) infer a fault type of the fault detected, including a faulty phase and a fault current. The comparing involves measuring nodal voltage and injected and absorbed nodal current phasors provided by the phasor measurement units at the network buses; for each augmented network topology, obtaining a network admittance matrix; computing a measurement function of the state estimator; computing an estimated state from the measured nodal voltage and injected or absorbed nodal current phasors; computing the weighted measurement residuals. The comparing further preferably comprises steps of computing the mean value of weighted measurement residuals of the plurality of state estimators; and if the difference between the computed mean value and the computed mean value computed in the previous time instant exceeds a predefined threshold, the presence of a fault is detected; and if a fault is detected, identify the state estimator with the lowest value of weighted measurement residuals providing the faulted line; and compute the nodal voltage and absorbed nodal current phasors at the virtual bus located in the identified faulted line providing the fault type and fault currents.

In a preferred embodiment, the method further preferably comprises steps of implementing a relaying functionality by providing the following devices: phasor measurement units as devices capable of producing time-synchronized measurements of fundamental frequency phasors of nodal voltages and injected/absorbed nodal currents, a communication layer configured to transfer data from the phasor measurement units to a data concentration point; and providing the data from the data concentration point to the step of solving a plurality of parallel phasor measurement units based real-time state estimators.

In a second aspect the invention preferably provides a system enabled to implement the method for a faulted line identification in a power network as described in the first aspect, the system comprising an electrical grid; a plurality of sensing devices, configured to be connected to the electrical grid; a communication network; a computing device, comprising at least a data concentrator; a fault detection and faulted line identification system; a plurality of state estimators. For each of the plurality of sensing devices, an output transmits an encapsulated data signal to the data concentrator by means of the communication network, the data concentrator being configured to decapsulate the data signal, further wherein the decapsulated data signal is output to the plurality of state estimators to be processed and output to the fault detection and faulted line identification system.

BRIEF DESCRIPTION OF THE SEVERAL VIEWS OF THE DRAWINGS

The invention will be better understood in light of the detailed description of preferred embodiments and in reference to the drawings, wherein FIG. 1 contains an illustration of a flowchart of a fault detection and location method according to one aspect of the invention;

FIGS. 11-33, that represent Tables I-XXIII respectively, show results from the methods and systems described herein, with FIG. 31 (Table XXI) including the zero and positive sequence electrical parameters of the lines composing the real distribution network adopted in this work and located in the Netherlands. FIG. 32 (Table XXII) provides the stds adopted for the combination of measurement sensors and PMUs. The measurement stds corresponding to the case of Noise level 1 and Noise level 10 described in the section concerning faulted line identification are given. FIG. 33 (Table XXIII) provides the stds adopted for the combination of current protection sensors and PMUs assumed to be installed in bus #1 of the distribution network under test.

DETAILED DESCRIPTION OF PREFERRED EMBODIMENTS

Figure 1:
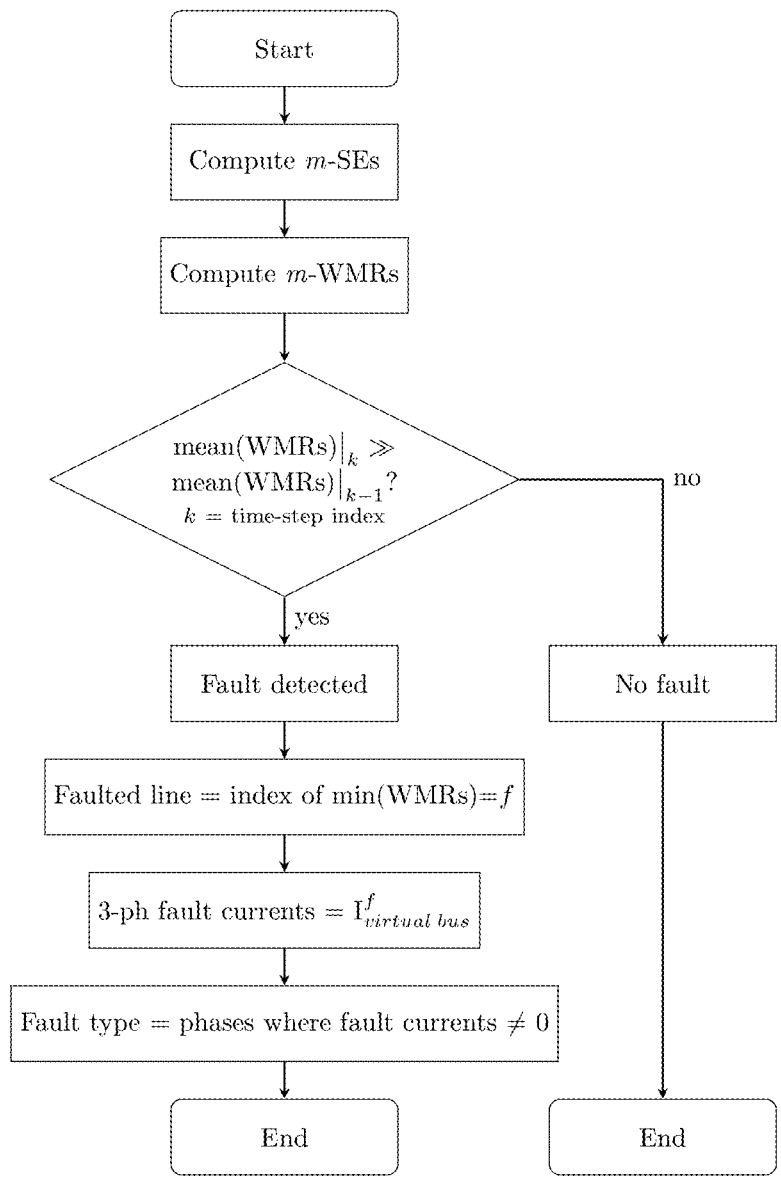

According to one aspect of the present invention, it has been found that a viable alternative to the two categories (1) and (2) mentioned above in the background discussion, is the wide-area fault location. As it is presented in this description, this approach allows to use more reliable measurements, which, in general, are not close to the fault. Within the context of PMU-based protections, according to one aspect of the present invention, the possibility of merging the relaying and fault location functionalities is presented, any for distribution or transmission networks by using PMU-based real-time state estimation. Indeed, beside their capability of bad data filtering, real-time SEs are characterized by high rejection of measurement noise and low time latency. The former property improves the assessment of the fault position, whilst the latter supports the stringent time requirements of protections.

Literature that explores the possibility of localizing faults by means of PMU-based state estimation is discussed in M. Shiroei, S. Daniar, and M. Akhbari, "A new algorithm for fault location on transmission lines," in Power Energy Society General Meeting, 2009. PES '09. IEEE, July 2009, pp. 1-5, hereinafter "the Shiroei publication," and P. Navalkar and S. Soman, "Secure remote backup protection of transmission lines using synchrophasors," IEEE Transactions on Power Delivery, vol. 26, no. 1, pp. 87-96, January 2011, hereinafter "the Navalkar publication." In the Shiroei publication, the fault is detected by using bad data identification techniques. An augmented state vector and the corresponding Jacobian matrix can be produced to estimate the fault location. In the Navalkar publication, the fault is detected by analyzing the residual vector of a synchrophasor estimator in order to have a backup protection scheme.

In contrast thereto, according to one aspect of the method, a different approach has been taken from existing solutions, at least because it relies on a PMU-only based sensing infrastructure to:

(i) detect, in real-time, the presence of a fault, (ii) identify in real-time, the faulted line, and (iii) infer the fault characteristics (i.e., faulty phases and fault current).

According to another aspect of the present invention, the method does not change regardless to the type of network. The type of fault, the fault impedance or the presence of DG, henceforth in the present description, the term faulted line identification is used interchangeably with the term fault location. This flexibility enables the use of the proposed approach as a single protection scheme in any power system. The line affected by the fault is determined by comparing the outputs of several parallel SEs using the weighted measurement residuals (WMRs). The validation is carried out for different noise levels derived from PMU measurements recorded in a real distribution network. Furthermore, the present description contains the validation performed on a real-time simulator, where the network model of a real distribution network, a test transmission network and their PMUs are implemented. To be noted that the PMU synchrophasor extraction algorithm used to estimate the synchrophasor measurements is the same as the one used in the context of a real PMU-monitored active distribution network. All these elements are setting realistic operating conditions for the validation of the proposed method. Finally, an analysis of the latencies introduced by different elements in the fault identification chain is provided.

The state of a power system can be observed by measuring nodal voltages and injected current synchrophasors in d network buses. This assumption enables the use of linear SEs, as explained later in this section. In what follows, we summarize the analytical formulation of a linear weighted least squares state estimator (LWLS-SE) for the case of a generic three-phase (3-ph) network.

Linear Weighted Least Squares State Estimator

The state for a 3-ph network with n buses $x \in R^N$ (N=3n·2) can be expressed in rectangular coordinates as follows:

$$x = [V_{1_{re}}{}^{a,b,c}, \ldots, V_{n_{re}}{}^{a,b,c}, V_{1_{im}}{}^{a,b,c}, \ldots, V_{n_{im}}{}^{a,b,c}]^T \quad (1)$$

where $$V_{i_{re}}{}^{a,b,c} = [V_{i_{re}}{}^a, V_{i_{re}}{}^b, V_{i_{re}}{}^c]$$

$$V_{i_{im}}{}^{a,b,c} = [V_{i_{im}}{}^a, V_{i_{im}}{}^b, V_{i_{im}}{}^c] \quad (2)$$

are respectively the 3-ph real and imaginary parts of the voltage phasors at bus #i.

We assume to have PMUs installed in d network buses that measure nodal voltages and injected current synchrophasors. The set of network buses equipped with PMUs is D.

Therefore, the measurement set $z \in R^D$ (D=3d·4) is composed of the real and imaginary parts of 3d phase-to-ground voltage phasors and 3d injected current phasors. It is defined as:

$$z = [z_V, z_I]^T \quad (3)$$

where $$z_V = [\ldots, V_{i_{re}}^{a,b,c}, \ldots, V_{i_{im}}^{a,b,c}, \ldots]^T$$

$$z_I = [\ldots, I_{i_{re}}^{a,b,c}, \ldots, I_{i_{im}}^{a,b,c}, \ldots]^T \quad (4)$$

in which $i \in D$.

The equation that relates the measurements and the state variables is the measurement function defined as:

$$z = Hx + v \quad (5)$$

where H is the measurement matrix and v is the measurement noise vector. We assume that v is a Gaussian white noise:

$$p(v) \sim N(0, R) \quad (6)$$

where R is the measurement noise covariance matrix that represents the accuracy of the measurement devices. Since we assume the measurement errors are not correlated, it is defined as:

$$R = \mathrm{diag}(\sigma_1^2, \ldots, \sigma_D^2) \quad (7)$$

where $\sigma_i^2$ is the variance of the $i^{th}$ element of z.

It is worth observing that the accuracies of the synchrophasors are expressed in polar coordinates. Since we here adopt rectangular coordinates, we need to project them from polar to rectangular. In this projection, the normality of the error distributions in rectangular coordinates is granted if and only if the deviations in amplitude and phase are small, which is the case for PMUs.

The measurement matrix H is composed of two submatrices $H_V$ and $H_I$:

$$H = \begin{bmatrix} H_V \\ H_I \end{bmatrix}. \quad (8)$$

$H_V$ relates the voltage measurements to the state and consists of ones and zeros that are directly inferred from Equation (5). $H_I$ relates the injected current measurements to the state and contains the elements of the network admittance matrix. The real and imaginary parts of the 3-ph injected current phasors are:

$$I_{i_{re}}^p = \sum_{h=1}^{n} \sum_{l=1}^{3} \left[ G_{ih}^{pl} V_{h_{re}}^l - B_{ih}^{pl} V_{h_{im}}^l \right] \quad (9)$$

$$I_{i_{im}}^p = \sum_{h=1}^{n} \sum_{l=1}^{3} \left[ B_{ih}^{pl} V_{h_{re}}^l - G_{ih}^{pl} V_{h_{im}}^l \right] \quad (10)$$

where i and h are the bus indexes, p and l are the phase indexes, G and B are respectively the real and imaginary parts of the elements of the network admittance matrix. Therefore, $H_I$ is derived from Equation (9) and (10):

$$H_I = \begin{bmatrix} G_{ih}^{pl} & -B_{ih}^{pl} \\ B_{ih}^{pl} & G_{ih}^{pl} \end{bmatrix}. \quad (11)$$

Note that the formulation of the problem in rectangular coordinates allows to define a measurement matrix H that does not contain any approximation. Indeed, since we assume that the network admittance matrix is not affected by errors, H is exact.

The LWLS-SE maximizes the likelihood that, as known, is equivalent to minimizing the following objective function:

$$J(x) = \sum_{i=1}^{D} \frac{\left(z_i - \sum_{h=1}^{N} H_{ih} x_h\right)^2}{R_{ii}}. \quad (12)$$

then we calculate the so-called Gain Matrix.

$$G = H^T R^{-1} H \quad (13)$$

and the estimated state is equal to:

$$\hat{x}_{LWLS} = G^{-1} H^T R^{-1} z. \quad (14)$$

Fault Detection and Location Method

According to some aspects of the present invention, the detection and location method and system rely on the following assumptions:

(1) Knowledge of the network admittance matrix (i.e., H is exact). This assumption implies the knowledge of (i) network topology and (ii) line parameters. For (i), it has to be noted that PMUs are able to record and stream Boolean variables together with the synchrophasor data. These Boolean inputs may correspond, as it is the case for the real network described in this paper, to the status of the breakers connected to a given PMU-monitored substation. Once the status of all the breakers is collected by the phasor data concentrator, it is straightforward to obtain the incidence matrix of the network and, thus, its topology and corresponding admittance matrix used in Equation (11). This aspect is a further advantage of using PMUs for protection since the topology assessment can be easily reconstructed and time-tagged with limited latencies. In the case where not all the PMUs can measure the status of the breakers in the substation, the literature provides several methods to estimate the topology or detect topology errors, with or without using PMU measurements. Concerning (ii), distribution and transmission networks are usually composed of overhead lines and cables that have a standard configuration with known electrical parameters. Therefore, we suppose that the network operator knows these characteristics.

(2) The measurement noise covariance R is known. This is a common assumption in power systems since the characteristics of the measurement devices, and therefore their accuracy, is usually known in detail.

(3) PMUs are installed in every bus: D=N. While PMUs have been extensively used in transmission networks, it is worth observing that the current literature has shown a growing interest in PMU deployment and their applications also in distribution systems: recent publications have illustrated and discussed distribution networks equipped with PMUs in every bus.

(4) Due to the stringent time requirements of the targeted application, bad data are removed from the measurement set by using a pre-filtering algorithm that is robust against faults.

Observation:

A fault on a line can be modeled as an event that suddenly increases by one the total number of buses in the monitored network. This additional bus, hereafter called virtual bus, is between two real buses and absorbs the fault current.

Let us consider a n-buses and m-lines power system equipped with PMUs at every bus. We can define m parallel SEs fed with the same measurement set, but each one uses a slightly different network topology from the others. The difference in the topology is given by the position of the virtual bus. The $j^{th}$ SE (j=1, ..., m) considers the existence of a virtual bus in the middle of the $j^{th}$ line by using an augmented state vector $\check{x}$. We add the virtual bus voltage phasors to the state defined in Equation (1) as follows:

$$\check{x} = [V_{1_{re}}^{a,b,c}, \ldots, V_{n_{re}}^{a,b,c}, V_{n+1_{re}}^{a,b,c}, V_{1_{im}}^{a,b,c}, \ldots, V_{n_{im}}^{a,b,c}, V_{n+1_{im}}^{a,b,c}]^T \quad (15)$$

where $V_{n+1_{re}}^{a,b,c}$ and $V_{n+1_{im}}^{a,b,c}$ are respectively the real and imaginary part of the voltage in the virtual bus. The measurement matrix H is modified accordingly for each SE.

During normal operating conditions, each of the m-virtual buses does not absorb any current and the different topologies do not play a role in the outputs of each SE. Therefore, the minimization of the objective function of Equation (12) will provide similar results for all the m-SEs so that:

$$\check{x}^j \simeq x_{true} \, \forall j \quad (16)$$

Let us assume a generic fault (i.e., phase to ground, phase to phase or three phase) on the line $L_{h,u}$ between buses #h and #u. From the physical point of view, a certain amount of current is drawn from an unknown position between buses #h and #u. The $j^{th}$ SE uses the measurement set z and its own specific topology (namely its matrix $H^j$) according to Equations (13) and (14). Let us assume that the $f^{th}$ SE has the virtual bus placed in the middle of line $L_{h,u}$. Intuitively, its topology is the one closest to the real network, even if the fault is not located exactly in the middle of the line. Therefore, it provides an estimated state close to the true one:

$$\check{x}^f \simeq x_{true}$$

$$\check{x}^j \neq x_{true} \, \forall j \neq f \quad (17)$$

Since the position of the fault is not known a priori, it is necessary to identify the SE providing the best estimated states. The WMR is the metric used to determine the best SE:

$$WMR^j = \sum_{i=1}^{D} \frac{|z_i - \check{z}_i^j|}{\sqrt[2]{R_{ii}}} \quad j \in [1, \, , m] \quad (18)$$

where $\check{z}^j = H^j \check{x}^j$.

In case of no fault, the WMR of all the SEs are very close to each other. By the time a fault occurs, m−1 SEs converge to a solution far from the true state and are characterized by high WMRs. The SE that has the virtual bus placed in the faulted line has the lowest WMR. Therefore, it is immediate to identify the line affected by the fault.

Figure 7:
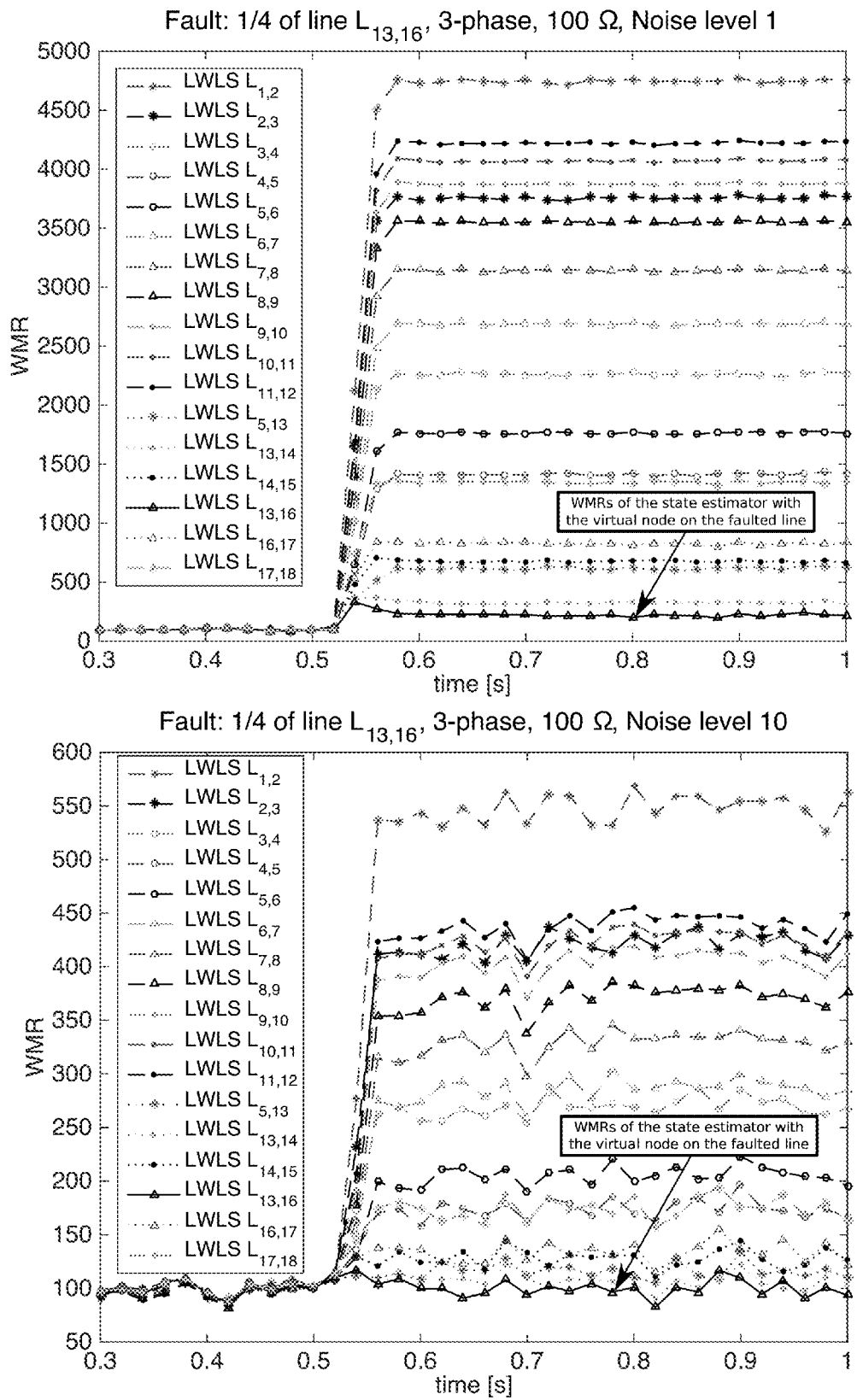
FIG. 7 contains graphs illustrating weighted measurement residuals of m-state estimators in case of a 3-phase high impedance fault at a quarter of line $L_{13,16}$ of FIG. 2 occurring between 0.5 and 0.52 seconds; Two noise levels are shown: (a) Noise level 1; and (b) Noise level 10.

The detection of the fault is performed by comparing the mean of the WMRs of the m-SEs, called $WMR_{mean}$. When the difference between the $WMR_{mean}$ of two consecutive time-steps has a sudden increase, a fault is detected, see FIG. 7 under Faulted line identification. Moreover, the state returned by this SE is used, together with its admittance matrix, to compute the estimated fault currents. The phases of the virtual bus in which the estimated current differs from zero are the ones affected by the fault, so that also the fault type is identified.

A flowchart summarizing the proposed method is given in FIG. 1. For every new data set coming from the PMUs, we compute the m parallel SEs, their m-WMRs and the mean of the WMRs. Comparing the mean of the WMRs of two consecutive time-steps, we detect the presence of a fault. If a fault is detected, the index f, associated to the SE with the minimum WMR, identifies the faulted line. Finally, we can use the estimated state returned by the $f^{th}$ SE to estimate the fault currents and identify the fault type from it.

In summary, with the proposed method is possible to:
detect the existence of a fault;
identify the faulted line;
estimate the fault currents;
identify the fault type (1-ph, 2-ph or 3-ph).

Simulation Environment

In order to assess the accuracy and time latency of the proposed method we have modeled a real active distribution network, a commonly used test transmission network, and their measurement devices in a real-time simulator (RTS).

Distribution Network Description

Figure 2:
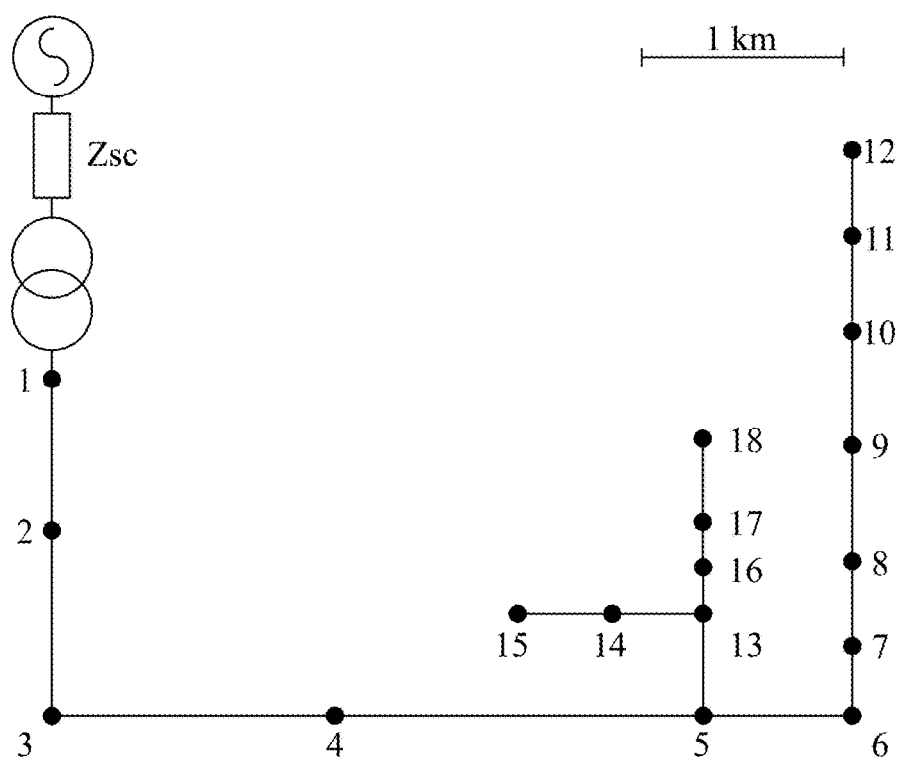
FIG. 2 illustrates a layout of a network for a simulation environment with an 18-bus distribution feeder.

The considered network is a real 10-kV 3-ph distribution network located in the Netherlands and operated by Alliander. The network is being equipped with PMUs within the context of the EU project C-DAX. It has 18 buses and its layout is reported in FIG. 2. The powers absorbed by the loads are unbalanced. The network is composed of underground cables with cross sections from 95 to 240 mm². Their electrical parameters are provided in the Appendix. The network has been modeled in SimPowerSystem™ and the simulations are run by using the Opal-RT RTS. The lines are modeled with the equivalent PI circuit, the upstream grid has a short circuit power of 1000 MVA and it is modeled with the short circuit impedance $Z_{sc}$ (we assumed a resistance to reactance ratio $R_{sc}/X_{sc}=1/10$). The high to medium voltage transformer can be either Yg-Yg or Yg-Y, according to the simulation scenario that might request earthed or unearthed neutral networks, respectively. The loads are modeled as star connections of impedances. In normal operating conditions they absorb approximately ¼ of the rated power of the real transformers to which they are connected. Loads are connected in all the buses, from bus #2 to #18.

Transmission Network Description

Figure 3:
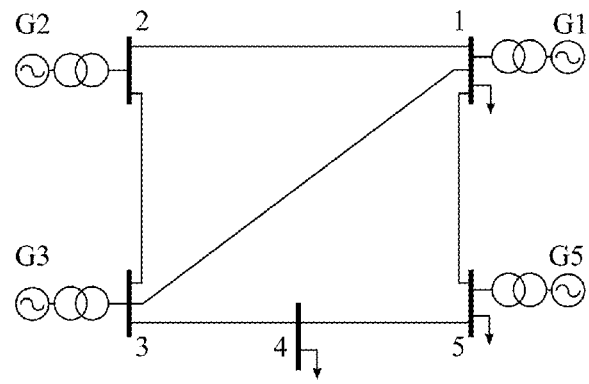
FIG. 3 illustrates a layout of a network for a simulation environment with a transmission network.

The network used is a modified version of the PJM 5-bus system. Its layout is reported in FIG. 3. The injected/absorbed powers together with the line parameters are provided in F. Li and R. Bo, "Small test systems for power system economic studies," in Power and Energy Society General Meeting, 2010 IEEE, July 2010, pp. 1-4, this reference being herewith incorporated by reference in its entirety. The network has been modeled in SimPowerSystem™ and the simulations are run by using the Opal-RT RTS. The lines are modeled with the equivalent PI circuit. The medium to high voltage transformers are Yg-Yg, a common choice in transmission networks. The loads are modeled as star connections of impedances. In normal operating conditions they absorb the active and reactive power. Loads are connected to buses #1, #4 and #5.

Description of the Adopted PMUs

Figure 4:
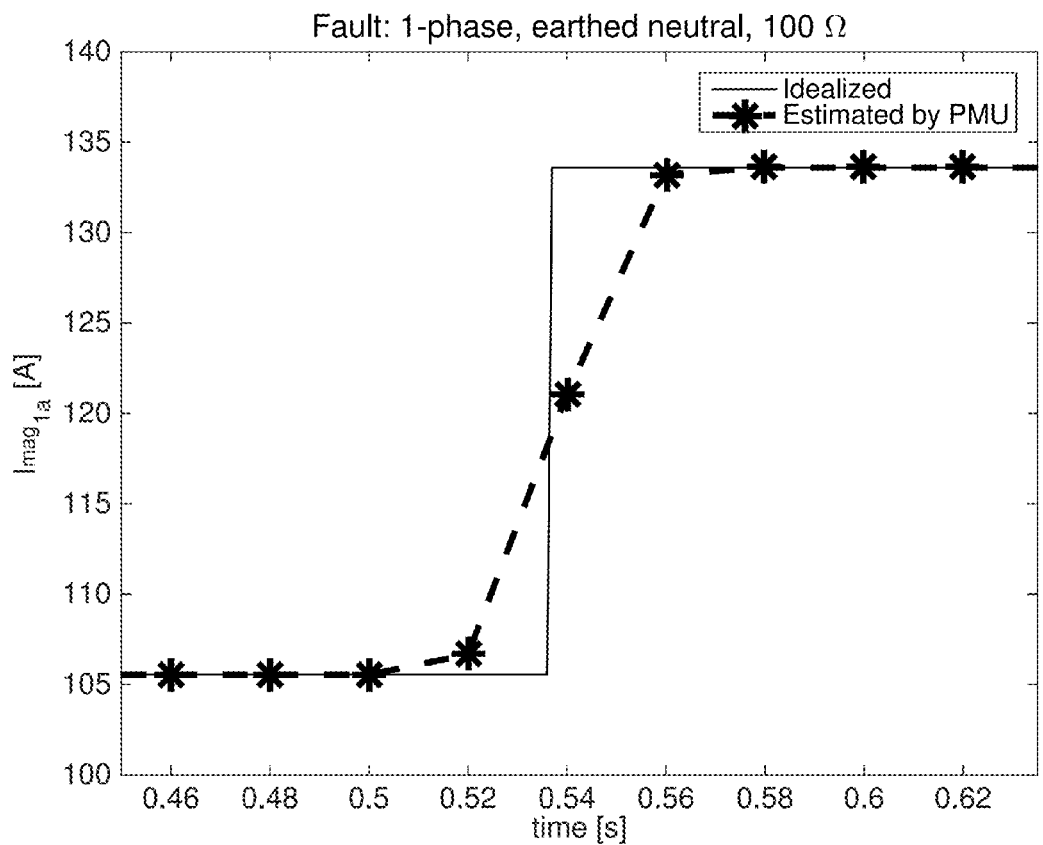
FIG. 4 shows a comparison between current phasor magnitude estimated by a simulated phasor measurement unit in bus #1 as referenced by FIG. 2 and the idealized current, during a fault.

The modeled networks have been equipped with PMUs in every bus measuring nodal voltage and injected current phasors. The PMU is based on the process illustrated in P. Romano and M. Paolone, "Enhanced interpolated-DFT for synchrophasor estimation in FPGAs: Theory, implementation, and validation of a PMU prototype," IEEE Transactions on Instrumentation and Measurement, vol. 63, no. 12, pp. 2824-2836, December 2014, hereinafter "the Romano publication," this reference being herewith incorporated by reference in its entirety. The Romano publication adopts the enhanced interpolated DFT algorithm to extract the synchrophasors. The use of simulated PMUs makes the validation of the proposed method more realistic compared to the common practice of using synchrophasors generated from the true state. Indeed, the adoption of a real synchrophasor estimation algorithm allows to model the PMU's behavior during transients, i.e. its response time. The latter is mainly affected by the window length used by the algorithm and the position of the timestamp within the window. A comparison of the time evolution of the current phasor magnitude estimated by the modeled PMU in bus #1 during a fault versus the idealized current phasor magnitude is given in FIG. 4. It can be seen that for this specific class-P PMU characterized by a window length of 3 periods and the timestamp centered in the window, the magnitude estimates take 4 time-steps to reach the pre-fault accuracy level. This aspect is taken into account under the section computation time and latency to assess the total latency of the proposed method.

Measurement Noise Model

Generally, the robustness of fault detection and location algorithms is tested with respect to the measurement noise. As mentioned in the previous section concerning Description of the adopted PMUs, the simulated PMU introduces only the noise due to the synchrophasor estimation algorithm. It is then needed to superimpose a measurement noise to the synchrophasors estimated by the simulated PMU. The noise should also include the effect of the sensor interfacing the PMU to the network. In order to generate a realistic noise, real-field data have been used.

We have considered real measurements taken in the 20-kV distribution network of the Swiss federal institute of technology of Lausanne (EPFL), which has been equipped with PMUs at every bus measuring nodal voltage and injected current phasors. The voltage sensors are 0.1-class capacity voltage dividers, while the current sensors are 0.5-class Rogowski coils. They are connected to PMUs described the Romano publication, which are characterized by a sampling frequency of 10 kHz and a reporting rate of 50 frames-per-second. These real PMUs run the same synchrophasor estimation algorithm as the simulated ones used in this work.

Figure 5:
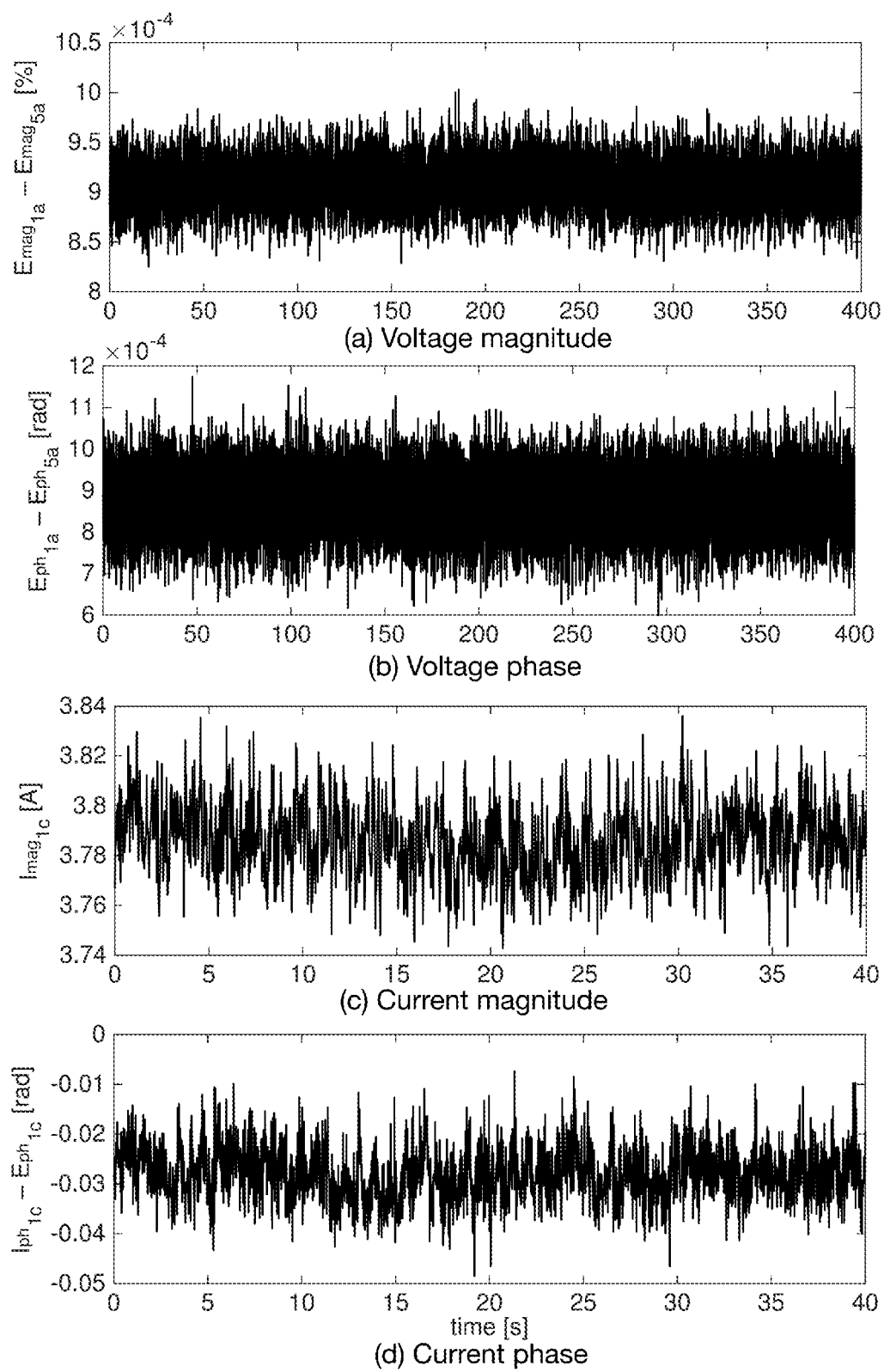
FIG. 5 shows real voltage and current measurements taken in the 20-kV distribution network of the Swiss Federal Institute of Technology of Lausanne (Ecole Polytechnique Fédérale de Lausanne, "EPFL"), whereby the signals include the noise introduced by the sensor and the phasor measurement unit, the noise standard deviations inferred from these signals being shown in Equation (19) to be found herein below.

FIG. 5 shows the magnitude and phase of nodal voltage and injected current measurements. Note that these measurements include the noise introduced by the combination of sensor and PMU. The corresponding standard deviations (stds) are:

$$\sigma_{V_{mag}}=1.6\cdot 10^{-3}\%\ \sigma_{V_{ph}}=5.1\cdot 10^{-5}\ [\text{rad}]$$

$$\sigma_{I_{mag}}=4.0\cdot 10^{-1}\%\ \sigma_{I_{ph}}=5.8\cdot 10^{-3}\ [\text{rad}] \quad (19)$$

Figure 6:
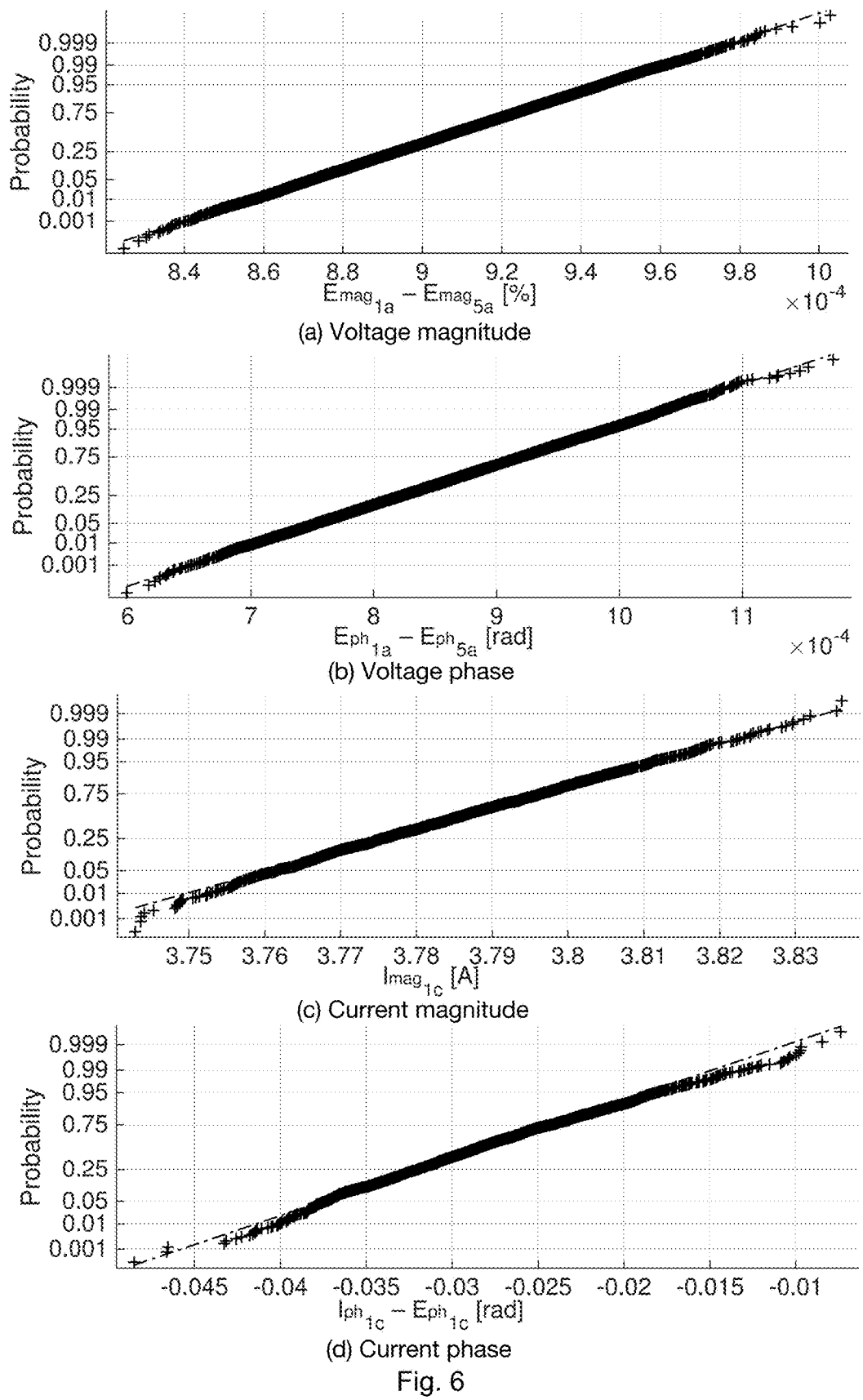
FIG. 6 shows normal probability plots of the measured quantities shown in FIG. 5, whereby the assumption of normality of the measurement noises is satisfied.

Furthermore, FIG. 6 shows that the Gaussian assumption of the measurement noises is fulfilled. The voltage and current phases are referred to the phase of another quantity (see FIGS. 5b and 5d) because the phase is continuously changing due to the fact that the real system frequency is not exactly 50 Hz. The std of the voltage phase is $1/\sqrt{2}$ of the one of $(E_{ph_{1a}}-E_{ph_{5a}})$ since we assume that the two voltage noises have the same std and are uncorrelated (the same assumption holds for the voltage magnitude noise). On the contrary, we entirely attribute the noise of $(I_{ph_{1c}}-E_{ph_{1c}})$ to the current phase. We assume the measurement noise model to be the same for transmission and distribution networks. Indeed, it is important to observe that the graphs of FIG. 5 are obtained on a distribution network and they include both the measurement noise and the network dynamics. Therefore, the computed stds are overestimated for transmission networks that are usually considered in quasi steady-state.

Further assumptions for distribution networks have to be made in order to simulate the realistic behavior of the sensing system:

(1) We use current protection sensors in bus #1 to measure the current during the fault. Their accuracy is assumed to be 10 times worse than the one defined in A. Abur, H. Kim, and M. Celik, "Identifying the unknown circuit breaker statuses in power networks," IEEE Transactions on Power Systems, vol. 10, no. 4, pp. 2029-2037, November 1995, hereinafter "the Abur publication."

(2) The 1-phase low impedance fault in an unearthed neutral network leads the voltage in the faulted phase to drop to around 0.6% of the rated value. In this specific case, we consider an accuracy of these voltage measurements to be 100 times worse than the one defined in the Abur publication.

In the section performance assessment we carry out a sensitivity analysis of the proposed fault location algorithm with respect to the measurement noise. Current protection sensors are chosen because they have to be able to measure high fault currents.

Performance Assessment

The accuracy of the proposed method in identifying the line affected by the fault has been extensively tested. The scenarios refer to different combinations of the following factors:

Transmission network or distribution network operated with earthed or unearthed neutral;

Low, high or very high impedance faults (1Ω, 100Ω or 1000Ω);

Symmetric (3-ph) or asymmetric (1-ph-to-ground and 2-ph-to-ground) faults;

Fault at ¼ or ½ of the line length. Three lines are considered: $L_{4,5}$, $L_{9,10}$, $L_{13,16}$ for the distribution network and $L_{1,3}$, $L_{3,4}$, $L_{1,5}$ for the transmission network;

Presence of DG and different network operating conditions.

Faulted Line Identification

For a given fault scenario (e.g., 1-ph-to-ground low impedance fault, at ¼ of a specific line, on a distribution network operated with earthed neutral, without distributed generation), the procedure used to assess the accuracy of the proposed fault location method is the following:

(1) The model is implemented and run in Simulink by using the Opal-RT RTS. The synchrophasors estimated by the PMUs at 50 frames-per-second are recorded.

(2) M sets of measurements are obtained by perturbing the quantities inferred in step 1 with randomly-generated Gaussian white noise characterized by the stds given in the section measurement noise model (M is equal to 10000 in order to get results that are statistically significant). Note that the phase noise std is in radians, while the magnitude noise std is in percentage of the quantity X of step 1. Therefore, the magnitude and phase of the synchrophasor measurement $X_{meas}$ are calculated as follows:

$$X_{meas_{mag}} = X_{mag} + N(0, \sigma_{X_{mag}} \cdot X_{mag})$$

$$X_{meas_{ph}} = X_{ph} + N(0, \sigma_{X_{ph}}) \quad (20)$$

(3) Each set of measurement computed in step 2 is given to the m parallel SEs that return the m network states. The latter are compared with the set of measurements in order to obtain m WMR values. The index of the SE exhibiting the lowest WMR identifies the inferred faulted line. The proposed fault location method is successful if the inferred faulted line coincides with the real faulted line.

(4) The accuracy of the fault location method is represented by the percentage of success in correctly identifying the faulted line. It is computed as:

$$\text{accuracy} = \frac{M_s}{M} \cdot 100$$

where $M_s$ indicates the number of times the faulted line is correctly identified and M represents the number of sets of noisy measurements generated for the specific fault. As already mentioned, we chose a high value of M (M=10000) in order to obtain statistically significant results.

The accuracy of the proposed fault location method for each scenario is given in Tables I-XVIII. The tables also contain an analysis of the sensitivity of the proposed fault location method with respect to the noise level. The noise level is directly linked to the accuracy of the sensors, as described in detail in the Tables I-XVIII:

Noise level 1: the noise stds are the ones presented in the section concerning measurement noise model herein above, which are obtained from real 0.1-class voltage and 0.5-class current sensors;

Noise level 10: the noise stds for the measurement sensors and the current protection sensors are respectively 10 and 3 times larger than the ones presented in the section concerning measurement noise model. These values refer to significantly worse sensors and were chosen in order to represent a worst, but still realistic, scenario.

Note that the case of Noise level 10 for transmission networks corresponds to noise values that are very high for transmission networks, see Tables.

Distribution Network

In what follows, the method is validated on the distribution network presented in the section concerning Distribution network description. FIG. 7a shows the WMRs of the m-SEs as a function of time for the specific case of a 3-ph fault at a quarter of line $L_{13,16}$, with fault impedance of 100Ω and Noise level 1. The fault occurs between 0.5 and 0.52 seconds. The quick separation of the WMRs in the following time-steps allows the detection of the fault according to the algorithm presented in the section concerning fault detection and location method. After three time-steps (see FIGS. 4 and 8), it is evident that the LWLS with the virtual bus in line $L_{13,16}$ maintains the lowest WMR, therefore the fault location algorithm correctly identifies the fault in line $L_{13,16}$. It is worth observing that the fault in line $L_{13,16}$ is the most challenging to be identified among the three considered lines. This is due to the fact that line $L_{13,16}$ and its neighbor lines ($L_{5,13}$, $L_{13,14}$ and $L_{16,17}$) are short (218 to 510 meters), and the virtual buses positioned on these lines are close to the fault. Indeed, we can see from FIG. 7a that the WMRs of the SEs using these virtual buses are quite close to each other. As a consequence, when we apply a high level of measurement noise, the WMRs become noisier (see FIG. 7b), leading to a possible misestimation of the faulted line. However, it is important to point out that in the time-steps where the algorithm fails, it locates the fault in one of the lines adjacent to the faulted one.

Tables I and II refer to symmetric faults, namely 3-ph. The low-impedance fault is characterized by a fault impedance of 1Ω and leads to fault currents in the order of thousands of Amperes. The high-impedance fault is assumed to have a fault impedance of 100Ω that produces a fault current limited to tens of Amperes. Consequently, the high-impedance faults are very difficult to identify and locate. Unlike conventional schemes, the proposed method guarantees a correct fault detection and location in case of realistic noise level (i.e., Noise level 1). If we increase the noise level (i.e., Noise level 10), the percentage of success decreases for the case of high impedance faults. Indeed, high impedance faults cause less perturbation in the network state compared to the low impedance ones. The WMRs of the various SEs are closer to each other and the method becomes more sensible to noise, as already explained above. However, even with the high noise level and the fault impedance, the proposed method exhibits a quite high number of correct fault location estimates.

We can also notice that the algorithm is always less accurate in locating faults at a quarter of a line compared to the ones in the middle of a line. Indeed, the presented methodology assumes that each virtual bus is in the middle of a given line. However, in the experimental validation, the position of the fault was changed along the line (i.e. ½ or ¼ of the line length) but always keeping the virtual bus in the middle of the line. When the actual fault happens to be in the virtual bus (i.e., in the middle of the line), the topology of the system, and therefore its admittance matrix, matches exactly what it is happening in the simulated system. For this reason, we achieve higher accuracy when the fault is in the middle of the line. However, we have shown that even for fault locations not on the virtual bus, we do achieve the correct identification of the faulted line.

The same considerations about symmetric faults can be extended to the other scenarios. We can further observe that the proposed fault location method has slightly reduced performance in locating a low impedance fault only in case of a 1-ph fault in an unearthed neutral network with Noise level 10. The reason is that the voltage drops significantly in the faulty phase. As already mentioned in the section measurement noise model herein above, for this specific case we have used stds of the voltage magnitude and phase measurements in the faulty phase which are 100 times larger than the ones defined in measurement noise model Transmission Network The method is further validated on the transmission test bed presented in the section transmission network description. Tables XI-XVIII provide the percentage of success in identifying the fault for symmetric and asymmetric faults, with Noise level 1 and Noise level 10 for three selected lines at ¼ and ½ of their lengths. What commented for the distribution network holds true for the transmission network. On the other hand, it has to be highlighted that, in general, the noise affects less the state estimation results in transmission networks due to larger phasor displacements. This is reflected in an overall better performance of the method especially in case of Noise level 10.

As a conclusion, we can state that the proposed algorithm is able to correctly detect the fault and locate the faulted line irrespectively of the type of network, the neutral connection, fault type, fault impedance and fault position. The method is robust against realistic noise levels since, during the experimental validation, it never failed when using noises directly inferred from real-field data. The fault location accuracy decreases, but not significantly, only when we apply a noise level 10 times larger. However, this noise level is considerably larger than the real one and the success percentage of proposed method remains above 66% for both the networks under test.

In order to further test the proposed fault location method in distribution networks we have carried out another simulation with a higher fault impedance of 1 k$\Omega$. This is commonly considered one of the highest possible fault impedances since it refers to the typical electrical resistance of a biological body. The performance of the proposed method has been assessed considering a 1 k$\Omega$ 1-ph-to-ground fault in an unearthed neutral network. The reason motivating this choice is that, for this case, the fault current is limited in amplitude by the high network zero-sequence impedance, so that its value becomes comparable to the currents absorbed by the loads. Indeed, the simulation results show that fault location is more difficult in unearthed networks. We consider the case of Noise level 1 in order to match the realistic noise measured in the real network. The results are provided in Table XIX. It can be seen that, also for this extreme scenario, the proposed methodology is capable to identify the faulted line and type of fault in the large majority of the cases.

Faulted Buses

The fault on a bus has not been discussed so far because we assume to have PMU installed in every substation. Hence, the faulted node and the fault type are easily detected by using the measurements of the PMU installed in the faulted bus. For example, in case of 1-ph fault in a node of an unearthed neutral network:
(i) the voltage zero-sequence component has a non-null value;
(ii) the current magnitude in the faulted phase has a sudden jump of tens of Amperes.

Distributed Generation

The performance of the method has been also assessed when dealing with faults in networks characterized by a large penetration of DG. The loads in bus #4, #10 and #17 have been coupled with variable pitch wind turbine models driving 160 kW squirrel cage asynchronous generators running at nominal speed. The power requested by the loads has been varied in order to create three different scenarios.

Case 1: a passive network where the loads absorb approximately ¼ of the rated power of the real secondary substation transformers and the DG does not cover the load demand.

Case 2: an intermediate scenario where the loads absorb 50% of the power of Case 1, but the network is still passive.

Case 3: the loads absorb 10% of the power of Case 1 so that the DG production is abundantly larger than the load demand making the feeder exporting power towards the upstream grid. For these tests, we have used the case characterized by the worst accuracy performance, namely a high impedance fault (100$\Omega$) on line $L_{13,16}$ in an unearthed neutral network. Table XX shows the fault location accuracy for different fault types and noise levels. As expected, these results are close to the corresponding ones of Tables II, VI and X. Indeed, the presence of DG does not change the performance of the proposed method since state estimation is inherently not affected by the nature of the loads/generators.

Computation Time and Latency

The assessment of the speed of the algorithm in identifying the faulted line is a metric of interest when comparing the proposed method to existing fault location algorithms. In what follows we focus on two time latencies:
(i) the computation time of the proposed method and
(ii) the overall latency of the system to identify the faulted line.

The former is basically the time needed to compute the parallel SEs and then to go through the flowchart shown in FIG. 1. The computation time is affected by many factors, such as the size of the network, the number of measurements, and the type of state estimation technique employed. Comparing the two networks under test, the distribution one presents a larger number of measurements and unknown states and thus a larger computation time. The proposed method has been implemented in an Apple MacBook Pro with a 2.6 GHz CPU, 8 GB RAM, and MATLAB 2014b. The SEs are implemented in series and the computation time to run all the m-SEs is 11.0 ms with a std of 0.8 ms.

Figure 8:
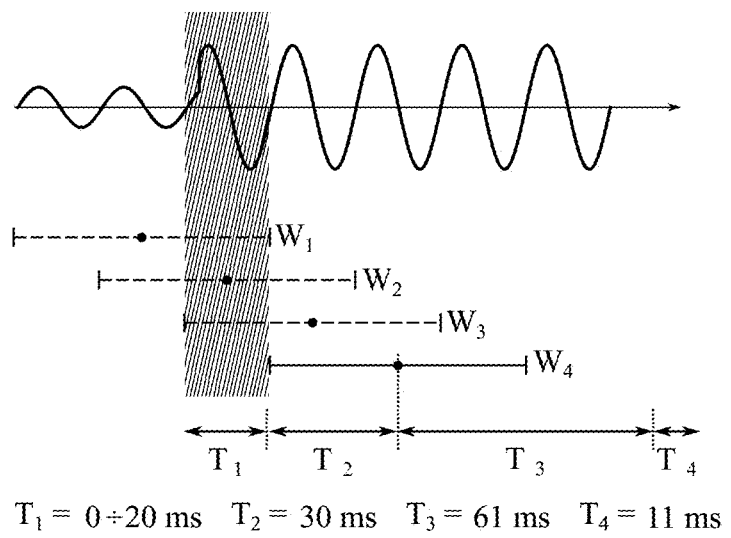
FIG. 8 contains a graph illustrating overall latency of the method according to the invention, in identifying faults.

The overall latency represents the time between the occurrence of the fault and its identification. It is worth noting that, in order to obtain a reliable and correct post-fault synchrophasor estimate, the PMUs have to process a dataset of raw-sampled waveforms that does not contain the instant in which the fault occurred. To clarify this aspect, FIG. 8 shows that whenever a fault occurs (e.g., in the grey area), three acquisition windows ($W_1, W_2, W_3$) are always corrupted. We remind that the adopted synchrophasor estimation algorithm uses a window containing three periods of the fundamental frequency. Then, $W_4$ contains the post-fault waveform without any step and the associated synchrophasor is correctly estimated. The total latency is therefore the sum of four contributions:
(i) $T_1$ that is the time between the fault event and the first sample of window $W_4$. Depending on when the fault occurs in the grey area of FIG. 8, $T_1$ can vary between 0 and 20 ms;
(ii) $T_2$ that corresponds to half of the acquisition window length used by the synchrophasor estimation algorithm. Using the synchrophasor estimation algorithm described in [8], $T_2$ is equal to 30 ms at 50 Hz;
(iii) $T_3$ is the time between the center of the acquisition window and the moment the set of measurements is fed to the SEs. It has been shown that $T_3$ can be equal to 61 ms with a std of 1.8 ms for a real distribution network. In a transmission network with a wired communication layer, only the propagation delay, an almost negligible percentage of the time $T_3$, increases due to longer links between PMUs and concentration point. In case of wireless links $T_3$ may become more important;
(iv) T4 is the computation time needed to run the m-SEs. For the case considered in this paper, $T_4$ is equal to 11 ms with a std of 0.8 ms.

Therefore, the overall latency can vary between 102 and 122 ms, depending on the instant the fault occurred.

Figure 9:
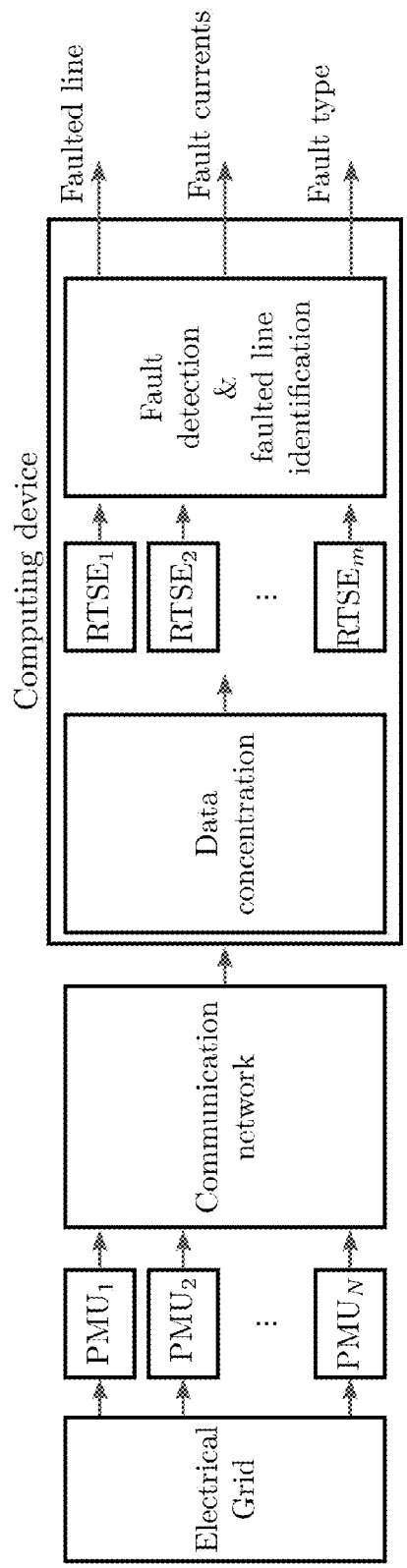
FIG. 9 contains an example architecture of a system in which the inventive method may be implemented, according to still another aspect of the present invention.

The method described above may be deployed in any infrastructure similar to the one schematically shown in FIG. 9. The block scheme consists of an electrical grid to which the sensing devices, i.e., synchrophasors (PMU) PMU1, PMU2, PMUN are connected. By means of a communication network, the synchrophasors reach a computing device where a data concentration is performed together with the fault detection and faulted line identification functionalities. As shown in the present description but not explicitly illustrated in FIG. 9, the electrical grid may consist in any distribution or transmission network, regardless of the high penetration of DGs, neutral connection and operating conditions. The sensing devices are interfaced to the electrical grid by means of voltage/current transducers (not shown in FIG. 9). Any type of PMU may be employed as long as it complies with the C37.118 standard and its throughput is sufficient to be compatible with the speed requirements of the fault detection and faulted line identification method presented in the paper. For example, in this work, each of the adopted PMUs estimates and streams 50 synchrophasors per second. Any encapsulation protocol (e.g., IEC 61850, IEEE C37.118.2) and transport protocol (e.g., UDP, TCP) may be used as long as the data concentration point is able to decapsulate them. Details about a possible implementation of the communication layer are given in M. Pignati, M. Popovic, S. Barreto, R. Cherkaoui, G. Dario Flores, J.-Y. Le Boudec, M. Mohiuddin, M. Paolone, P. Romano, S. Sarri, T. Tesfay, D.-C. Tomozei, and L. Zanni, "Real-time state estimation of the EPFL campus medium-voltage grid by using PMUs," in Innovative Smart Grid Technologies Conference (ISGT), 2015 IEEE Power Energy Society, February 2015, pp. 1-5, this reference herewith incorporated by reference in its entirety. Concerning the data concentration point, open-source software is available. Nevertheless, in the present example embodiment a GPS-synchronized data concentrator developed at the Distributed Electrical System laboratory (DESL) of the EPFL may be used. This allows to time-stamp the operations performed by the concentrator in order to keep track of the latency as reported in FIG. 8. Finally, the m-SEs together with the fault detection and faulted line identification functionalities, have already been widely described before in the text. Once a fault is detected and the faulted line is identified, one can act on the electrical grid breakers and/or switches to disconnect the faulted line.

Figure 10:
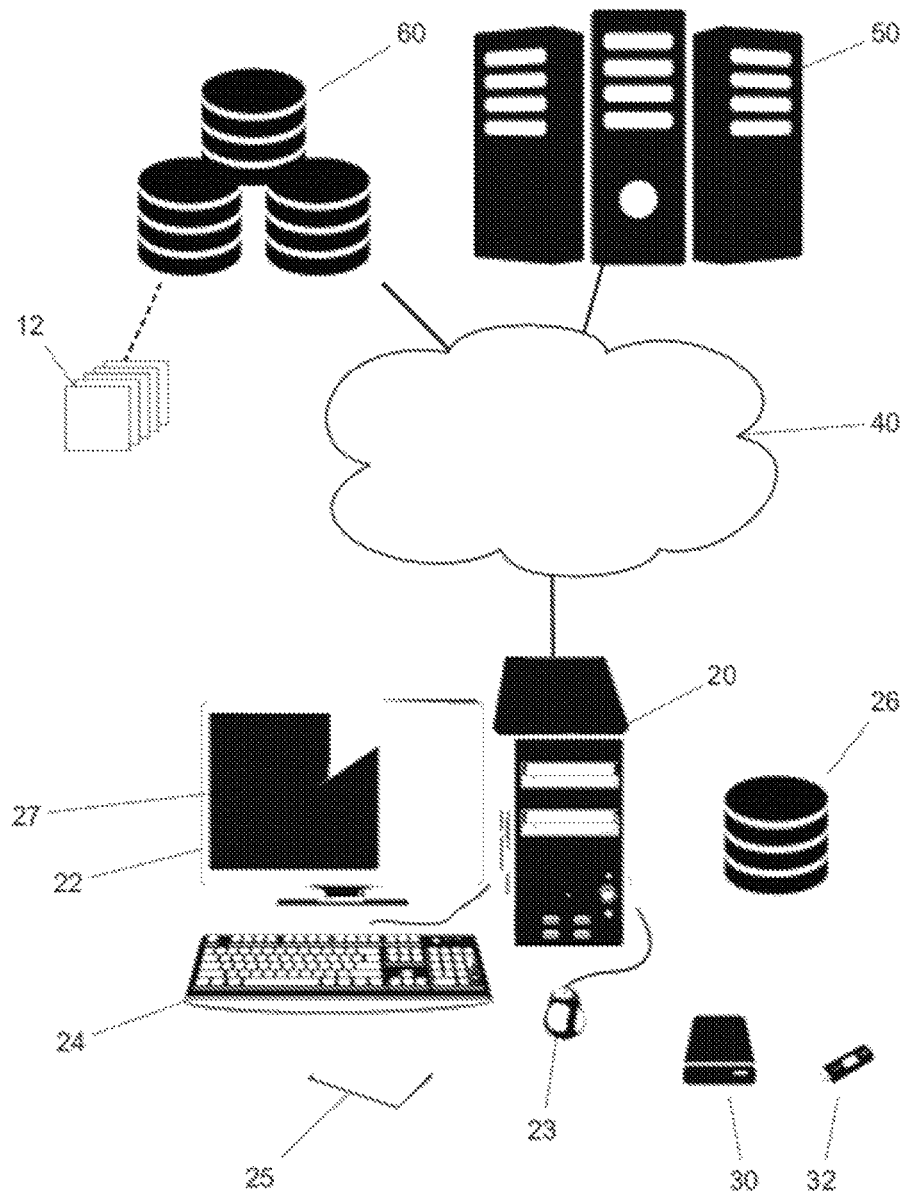
FIG. 10 depicts a schematic perspective view of a system for implemented the method and the architecture of FIG. 9, according to yet another aspect of the present invention.

FIG. 10 shows a perspective view of an exemplary device and system for implementing the method described above. The system includes a data processing device 20, for example but not limited to a personal computer (PC), Macintosh computer, laptop, notebook, netbook, data processing workstation, smartphone. A dataset 12 is schematically shown, for example a data set that describes the power grid network and topology, that can be located locally in a storage 26 associated with processing device 20, or can be accessed via the network 40, for example the Internet, from various remotely located devices, for example servers 50 and storage 60. Processing device 20 can be equipped with one or several hardware microprocessors, dedicated graphics processors, and with internal memory. Also, processing device 20 can be programmed to operate the data concentrator, the fault detection and faulted line identification system, and the plurality of state estimators and can be connected to the data communication network, to process data and to decapsulate data that is transmitted via the communication network.

Also, processing device 20 is connected to a data input device, for example a keyboard 24 to provide for user instructions for the method, computer mouse 23, or trackpad 25 and a data display device, for example a computer screen 22, to display different stages and final results of the data processing steps of the method, and the resulting data, for example, data on the faulted line, fault currents, and fault type can be outputted on the computer screen 22. For example, the graphical user interface 27 can be shown with such data. Processing device 20 is also connected to a network 40, for example the communication network for data of the electrical grid and the Internet to access various cloud-based and network based services, for example but not limited to cloud or network servers 50, cloud or network data storage devices 60, specific web servers providing databases of graphics data.

The method described above can also be performed on hardware processors of one or more servers 50, and the results sent over the network 40 for rendering and display on computer screen 22 via processing device 20. Processing device 20 can be equipped with a data input/output port, for example a CDROM drive, Universal Serial Bus (USB), card readers, storage device readers, to read data, for example computer readable and executable instructions, from non-transitory computer-readable media 30, 32. Non-transitory computer-readable media 30, 32 are storage devices, for example but not limited to external hard drives, flash drives, memory cards, USB memory sticks, CDROM, Blu-Ray™ disks, optical storage devices and other types of portable memory devices that are capable of temporarily or permanently storing computer-readable instructions thereon. The computer-readable instructions can be configured to perform the method, as described above, when loaded to processing device 20 and executed on a processing device 20 or a cloud or other type of network server 50.

While the invention has been disclosed with reference to certain preferred embodiments, numerous modifications, alterations, and changes to the described embodiments, and equivalents thereof, are possible without departing from the sphere and scope of the invention. Accordingly, it is intended that the invention not be limited to the described embodiments, and be given the broadest reasonable interpretation in accordance with the language of the appended claims.

The invention claimed is:

1. A method for a faulted line identification in a power network, the method being performed on a computer device having at least one processor, the method comprising:
at a generic time-instant, solving a plurality of parallel phasor measurement units based real-time state estimators by the computer, the plurality of state estimators having among each other different and augmented network topologies, wherein each of the different and augmented network topologies comprises
an original network topology, which comprises a plurality of real buses and real lines forming a connected graph mapping a real network topology, and
a single additional virtual bus located along one of the real lines, the one of the real lines in which the virtual bus is located being different for each of the augmented network topologies;
producing an estimated state for each state estimator with the computer;
comparing the estimated states of the plurality of state estimators by the computer to
(i) detect a presence of a fault;
(ii) identify a faulted line in which the presence of the fault is detected;
(iii) infer a fault type of the fault, including a fault phase and a fault current;
whereby the step of comparing includes
measuring nodal voltage and injected and absorbed nodal current phasors provided by phasor measurement units at the plurality of real buses;
for each of the augmented network topologies,
obtaining a network admittance matrix;
computing a measurement function of the state estimator;
computing the estimated state from the measured nodal voltage and injected or absorbed nodal current phasors;

computing weighted measurement residuals; and computing a mean value of the weighted measurement residuals of the plurality of state estimators; and if a difference between the computed mean value and a computed mean value computed in a previous time instant exceeds a predefined threshold, the presence of the fault is detected; and if the fault is detected, identify the state estimator with a lowest value of the weighted measurement residuals providing the faulted line; and compute the nodal voltage and absorbed nodal current phasors at the virtual bus located in the identified faulted line to infer the fault type.

2. The method of claim 1, further comprising the steps of:

implementing a relaying functionality by providing the phasor measurement units as devices configured to produce time-synchronized measurements of fundamental frequency phasors of the nodal voltages and injected and absorbed nodal currents, and a communication layer configured to transfer data from the phasor measurement units to a data concentration point; and providing the data from the data concentration point to the computer device for solving the plurality of parallel phasor measurement units based real-time state estimators.

3. A system enabled to implement the method for the faulted line identification in the power network as described in claim 1, the system comprising:

an electrical grid;

a plurality of sensing devices, configured to be connected to the electrical grid;

a communication network; and the computing device, comprising:

a data concentrator;

a fault detection and faulted line identification system; and the plurality of state estimators;

wherein for each of the plurality of sensing devices, an output transmits an encapsulated data signal to the data concentrator by the communication network, the data concentrator being configured to decapsulate the data signal, and wherein the decapsulated data signal is output to the plurality of state estimators to be processed and output to the fault detection and faulted line identification system.

4. The method of claim 1, further comprising the steps of: providing information on at least one of the fault, the faulted line, and the fault type to an operator with a data display device that is associated with the computer device.

5. The method of claim 1, wherein in the identifying the state estimator with the lowest value of weighted measurement residuals providing the faulted line, the faulted line is identified with reference to the original network topology of the power network.

* * * * *